(12) United States Patent
Kwon

(10) Patent No.: US 6,865,118 B2
(45) Date of Patent: Mar. 8, 2005

(54) BOOSTING CIRCUIT IN SEMICONDUCTOR MEMORY DEVICE

(75) Inventor: Yi Jin Kwon, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/739,249

(22) Filed: Dec. 18, 2003

(65) Prior Publication Data

US 2004/0240279 A1 Dec. 2, 2004

(30) Foreign Application Priority Data

May 29, 2003 (KR) ................................. 10-2003-0034547

(51) Int. Cl.⁷ ................................................ G11C 7/00
(52) U.S. Cl. .............................. 365/189.09; 365/189.11; 327/589; 327/321
(58) Field of Search ........................ 365/189.09, 189.11, 365/226; 327/589, 321

(56) References Cited

U.S. PATENT DOCUMENTS

| | | | | |
|---|---|---|---|---|
| 5,673,225 A | * | 9/1997 | Jeong et al. | 365/189.11 |
| 5,940,333 A | * | 8/1999 | Chung | 365/189.09 |
| 6,084,800 A | * | 7/2000 | Choi et al. | 365/185.23 |

* cited by examiner

*Primary Examiner*—Son Mai
(74) *Attorney, Agent, or Firm*—Marshall, Gerstein & Borun LLP (57) ABSTRACT

The Disclosed is a boosting circuit. A boosting voltage (VBOOT) is rapidly increased to a given voltage level in two steps by using a preboosting circuit unit and a bootstrap circuit unit. The boosting voltage (VBOOT) is dropped through a clamp circuit unit to generate a final target voltage. Therefore, it is possible to make fast read access time in a read operation, minimize consumption of current and generate a stabilized word line voltage (W/L).

8 Claims, 5 Drawing Sheets

BOOSTING CIRCUIT IN SEMICONDUCTOR MEMORY DEVICE

BACKGROUND

1. Field of the Invention

The present invention relates to a boosting circuit in a semiconductor device and, more particularly, to a boosting circuit in a semiconductor memory device that has rapid read access time in a read operation, and can minimize consumption of current and generate a stabilized word line voltage (W/L), by rapidly raising a boosting voltage (VBOOT) to a given voltage level in two steps using a preboosting circuit unit and a bootstrap circuit unit and then dropping the boosting voltage (VBOOT) through a clamp circuit unit to generate a final target voltage.

2. Discussion of Related Art

In memory cells of electrically erasable and programmable read only memory (EEPROM) being a kind of a nonvolatile semiconductor device, a program operation is performed by accumulating electrons on a floating gate electrode, and a read operation of data is performed by detecting variation in the threshold voltage (Vth) depending on the existence or nonexistence of the electrons. The EEPROM includes a flash EEPROM (hereinafter referred to as 'flash memory device') in which the erase operation of data is performed over the whole memory cell array or in each block unit after dividing the memory cell array into given blocks.

In order for the program operation, the erase operation and the read operation of the flash memory device to be performed, the role of a high voltage-generating circuit to generate high voltages (for example, Vpgm; program voltage, Vera; erase voltage, Vrea; read voltage) that are supplied to the control gate of the memory cell is very important. Due to the tendency that all the semiconductor memory devices have a low voltage, recently, it is required that the flash memory device operates under a low voltage (for example, below 2V or below 1.7V). In accordance with this trend, in order to keep a rapid operating speed of the flash memory device, the role of the high voltage-generating circuit is very important.

Of the high voltage-generating circuit, a read voltage-generating circuit for performing the read operation employs a bootstrap circuit in order to increase the speed of the read operation. Such bootstrap circuit boosts a low potential power supply voltage to supply the boosted voltage to a word line through a row decoder. In the event that the low potential power supply voltage is boosted using this bootstrap circuit, if the word line voltage boosted by the bootstrap circuit is too low, it is difficult to exactly read the current of the memory cell. On the contrary, if the word line voltage boosted by the bootstrap circuit is too high, stress is given to the control gate of the memory cell. This causes a problem in data retention characteristics.

In the above, in order to solve the latter, a clamp circuit is positioned in the rear of the bootstrap circuit in order to drop the voltage boosted by the bootstrap circuit (hereinafter referred to as 'boosting voltage') to a target voltage.

Figure 1:
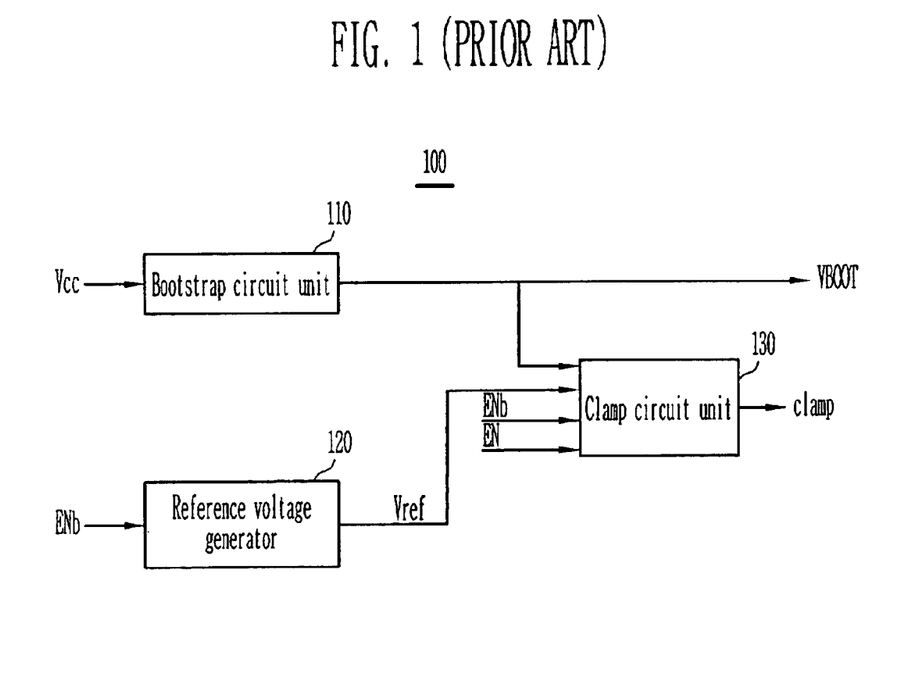
FIG. 1 is a block diagram illustrating the construction of a conventional boosting circuit in a semiconductor memory device.
Figure 2:
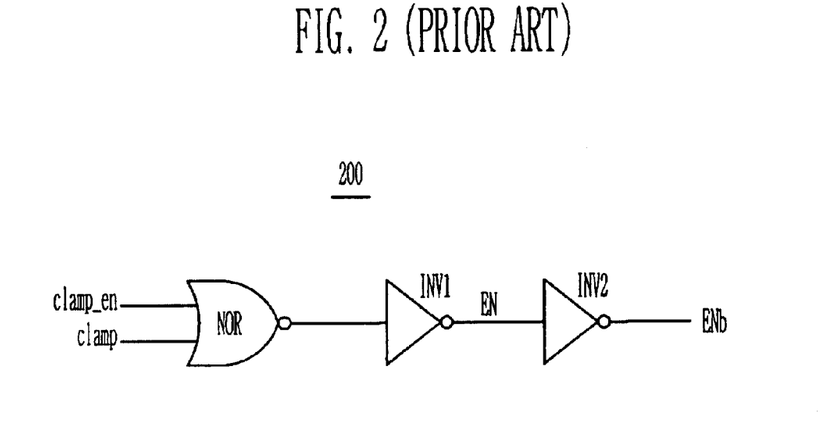
FIG. 2 shows an enable signal generator.

FIG. 1 is a block diagram illustrating the construction of a boosting circuit in a conventional flash memory device and FIG. 2 shows an enable signal generator.

Referring to FIGS. 1 and 2, a boosting circuit 100 includes a bootstrap circuit unit 110, a reference voltage generator 120 and a clamp circuit unit 130. The bootstrap circuit unit 110 boosts a low potential power supply voltage (Low Vcc) or a high potential power supply voltage (High Vcc) to output the boosting voltage (VBOOT). The reference voltage generator 120 is driven by an enable bar signal (ENb) to output a reference voltage (Vref). The clamp circuit 130 is driven by an enable signal (EN) and the enable bar signal (ENb) and compares the boosting voltage (VBOOT) outputted from the bootstrap circuit 110 and the reference voltage (Vref). As a result of the comparison, if the boosting voltage (VBOOT) is higher than a target voltage, the clamp circuit 130 drops the boosting voltage (VBOOT) to the target voltage.

In order to generate the stable boosting voltage (VBOOT), however, access time (i.e., time taken to drop the boosting voltage, after raising the boosting voltage to the target voltage) is lengthened.

SUMMARY OF THE INVENTION

The present invention is contrived to solve the aforementioned problems. The present invention is directed to a boosting circuit in a semiconductor device that has rapid read access time in a read operation, and can minimize consumption of current and generate a stabilized word line voltage (W/L), by rapidly raising a boosting voltage (VBOOT) to a given voltage level in two steps using a preboosting circuit unit and a bootstrap circuit unit and then dropping the boosting voltage (VBOOT) through a clamp circuit unit to generate a final target voltage.

According to the present invention, there is provided a boosting circuit in a semiconductor device, including a preboosting circuit unit for pumping a power supply voltage to output a high voltage using the coupling effect of a capacitor upon a boosting; a bootstrap circuit unit for selectively boosting the power supply voltage and the output voltage of the preboosting circuit unit to output a boosting voltage; a reference voltage generator for outputting a constant reference voltage regardless of variation in the power supply voltage; and a clamp circuit unit for comparing the boosting voltage outputted from the bootstrap circuit unit with the reference voltage outputted from the reference voltage generator, wherein the clamp circuit unit drops the boosting voltage to a target voltage when the boosting voltage is higher than the reference voltage.

The preboosting circuit unit includes a first transistor connected between the power supply voltage terminal and a first node, and driven by a first signal; a second transistor connected between the first node and a second node and driven by the first signal; a capacitor connected between the first node and a third node; a third transistor connected between the power supply voltage terminal and the third node, and driven by a second signal; and a fourth transistor connected between a ground voltage terminal and the third node, and driven by the second signal, wherein the power supply voltage is pumped using the coupling effect of the capacitor by the second signal, whereby the high voltage is outputted to the second node.

The first transistor and the fourth transistor are NMOS transistors, and the second transistor and the third transistor are PMOS transistors. The first signal is an inverted signal of a precharge enable signal, the second signal is an inverted signal of a first boot pump enable signal, and the precharge enable signal and a first boot pump enable signal are inputted as waveforms of the same level.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF PREFERRED EMBODIMENTS

The present invention will now be described in detail in connection with preferred embodiments with reference to the accompanying drawings, in which like reference numerals are used to identify the same or similar parts.

Figure 3:
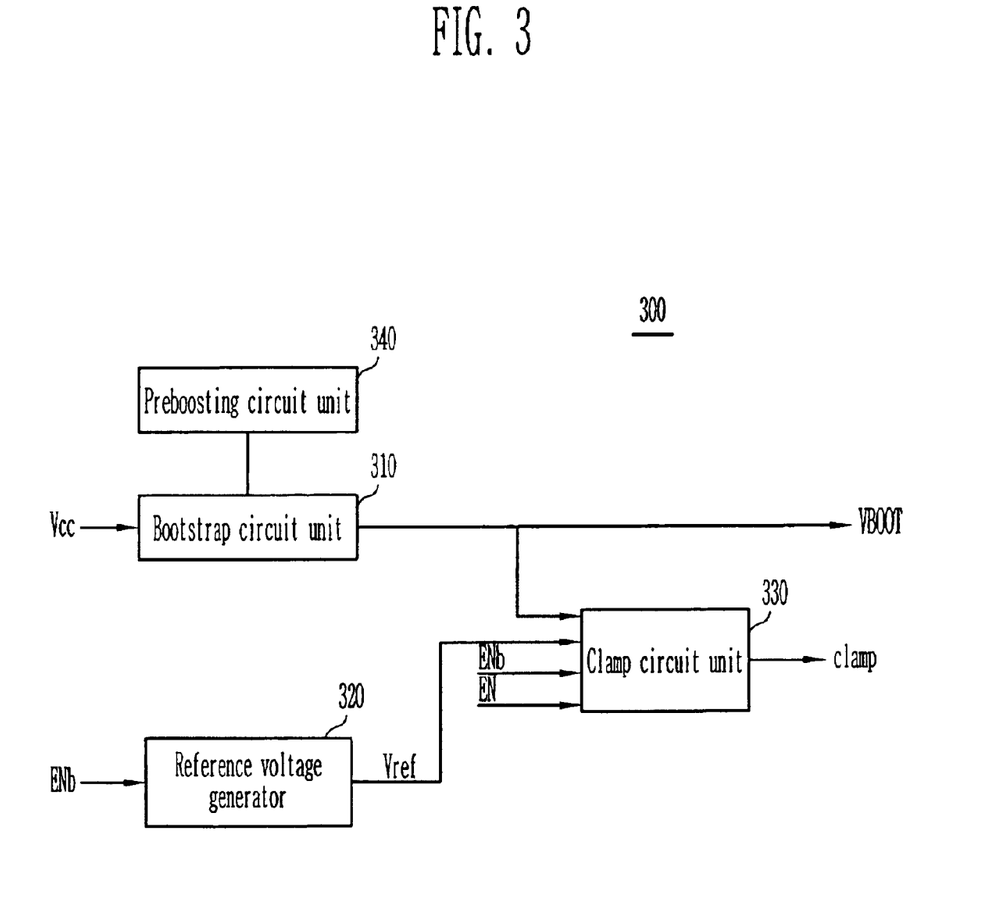
FIG. 3 is a block diagram illustrating the construction of a boosting circuit in a semiconductor memory device according to a preferred embodiment of the present invention.

FIG. 3 is a block diagram illustrating the construction of a boosting circuit in a semiconductor device according to a preferred embodiment of the present invention.

Referring to FIG. 3, the boosting circuit 300 according to the present invention includes a preboosting circuit unit 340, a bootstrap circuit unit 310, a reference voltage generator 320 and a clamp circuit unit 330. The preboosting circuit unit 340 pumps a power supply voltage using the coupling effect of a capacitor to output a high voltage upon a boosting. The bootstrap circuit unit 310 boosts a power supply voltage (Vcc) or the signal from the preboosting circuit unit 340 to output a boosting voltage (VBOOT). The reference voltage generator 320 is driven by an enable bar signal (ENb) to output a reference voltage (Vref). The clamp circuit unit 330 is driven by an enable signal (EN) and the enable bar signal (ENb) and compares the boosting voltage (VBOOT) outputted from the bootstrap circuit unit 310 with the reference voltage (Vref). As a result of the compassion, if the boosting voltage (VBOOT) is higher than the reference voltage (Vref), the clamp circuit unit 330 drops the boosting voltage (VBOOT) to a target voltage.

Figure 4:
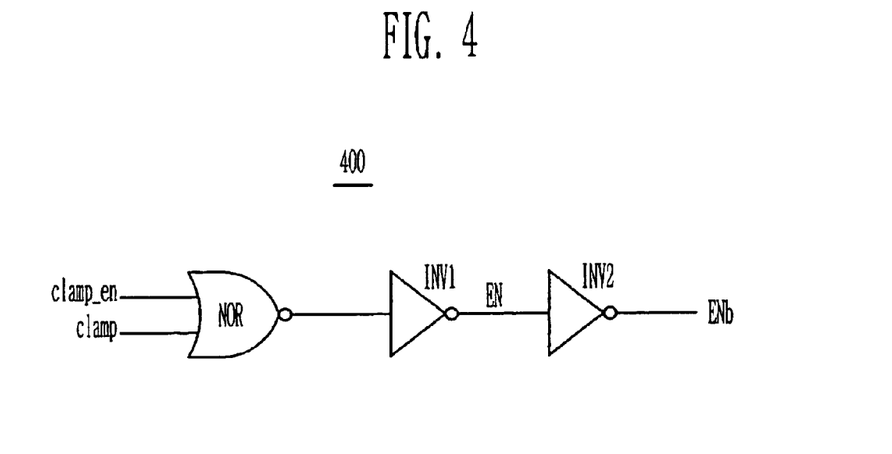
FIG. 4 shows an enable signal generator.

Meanwhile, the enable signal (EN) and the enable bar signal (ENb) could be obtained using an enable signal generator 400 shown in FIG. 4. The enable signal generator 400 includes a NOR gate NOR for performing a NOR operation for a clamp enable signal (clamp_en) and a clamp signal (clamp), a first inverter INV1 for inverting the output signal of the NOR gate NOR, and a second inverter INV2 for inverting the output signal (i.e., enable signal (EN)) of the first inverter INV1 to output the enable bar signal (ENb).

Figure 5:
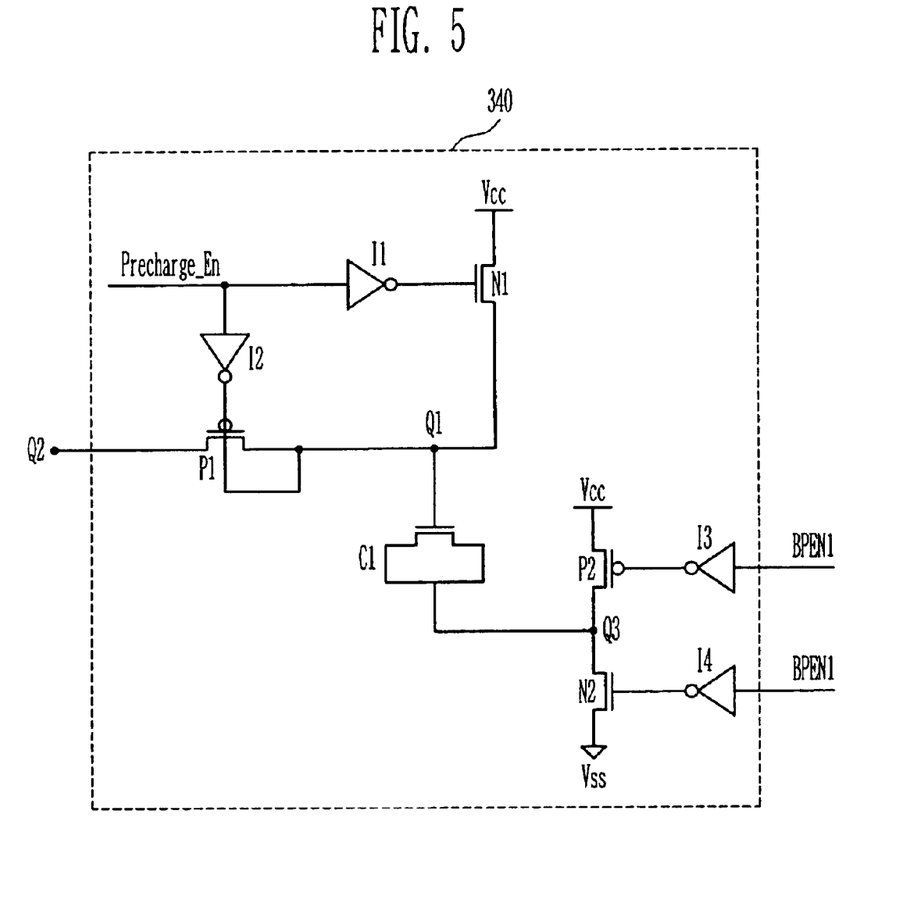
FIG. 5 is a circuit diagram for explaining a preboosting circuit according to a preferred embodiment of the present invention.

FIG. 5 is a circuit diagram for explaining the preboosting circuit 340.

Referring to FIG. 5, a first NMOS transistor N1 driven by an inverted signal of a precharge enable signal (Precharge-EN) is connected between the power supply voltage (Vcc) terminal and a first node Q1. The precharge enable signal (Precharge-EN) is inverted by a first inverter I1 to drive the first NMOS transistor N1. A first PMOS transistor P1 driven by the inverted signal of the precharge enable signal (Precharge-EN) is connected between the first node Q1 and a second node Q2. The precharge enable signal (Precharge-EN) is inverted by a second inverter I2 to drive the first PMOS transistor P1.

A first capacitor C1 is connected between the first node Q1 and a third node Q3. A second PMOS transistor P2 that is driven by an inverted signal of a first boot pump enable signal (BPEN1) is connected between the power supply voltage (Vcc) terminal and the third node Q3. The first boot pump enable signal (BPEN1) is inverted by a third inverter I3 to drive the second PMOS transistor P2. A second NMOS transistor N2 that is driven by the inverted signal of the first boot pump enable signal (BPEN1) is connected between the ground voltage (Vss) terminal and the third node Q3. The first boot pump enable signal (BPEN1) is inverted by a fourth inverter I4 to drive the second NMOS transistor N2.

Figure 6:
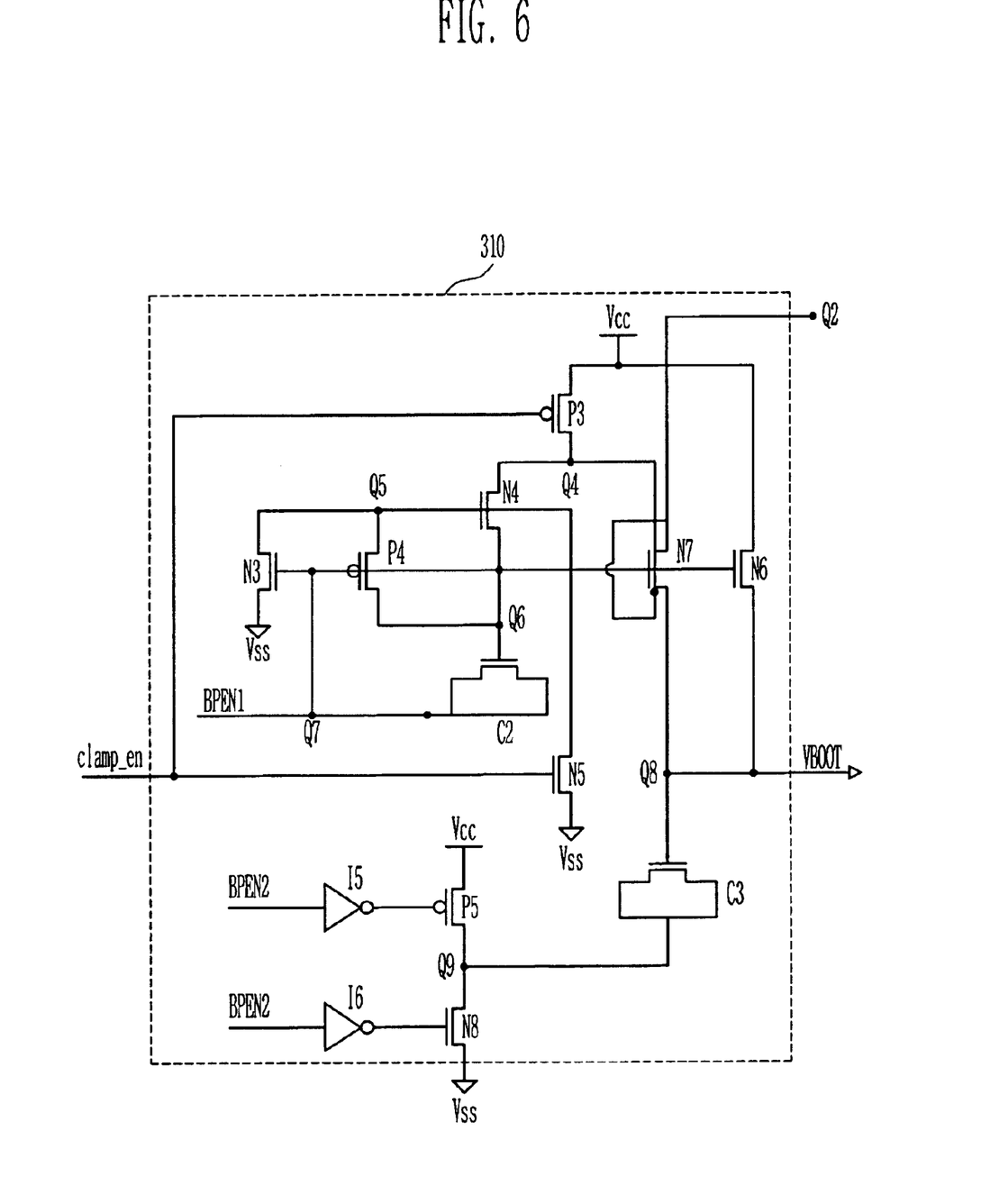
FIG. 6 is a circuit diagram for explaining a bootstrap circuit unit according to a preferred embodiment of the present invention.

FIG. 6 is a circuit diagram for explaining the bootstrap circuit unit 310.

Referring to FIG. 6, a third PMOS transistor P3 driven by the clamp enable signal (clamp_en) is connected between the power supply voltage (Vcc) terminal and a fourth node Q4. A third NMOS transistor N3 driven by the first boot pump enable signal (BPEN1) is connected between a fifth node Q5 and the ground voltage (Vss). A fourth NMOS transistor N4 driven by the potential of the fifth node Q5 is connected between the fourth node Q4 and a sixth node Q6. A fourth PMOS transistor P4 driven by the first boot pump enable signal (BPEN1) is connected between the fifth node Q5 and the sixth node Q6. To a seventh node Q7 is inputted the first boot pump enable signal (BPEN1). A second capacitor C2 is connected between the sixth node Q6 and a seventh node Q7. A fifth NMOS transistor N5 that is driven by the clamp enable signal (clamp-en) is connected between the ground voltage (Vss) terminal and the fifth node Q5. A sixth NMOS transistor N6 that is driven by the potential of the sixth node Q6 is connected between the power supply voltage (Vcc) terminal and an eighth node Q8. The sixth NMOS transistor N6 is a native transistor in which automatic precharge occurs. A seventh NMOS transistor N7 driven by the potential of the sixth node Q6 is connected between the fourth node Q4 and the eighth node Q8. The seventh NMOS transistor N7 has a triple transistor structure having a P-well to which the potential of the fourth node Q4 is applied, a drain terminal to which the potential of the second node Q2 is inputted and a source terminal to which the potential of the eighth node Q8 is inputted. The second node Q2 is a node connected to the preboosting circuit unit 340. A third capacitor C3 is connected between the eighth node Q8 and a ninth node Q9. The boosting voltage (VBOOT) is outputted through the eighth node Q8. A fifth PMOS transistor P5 driven by an inverted signal of a second boot pump enable signal (BPEN2) is connected between the power supply voltage (Vcc) terminal and the ninth node Q9. The second boot pump enable signal (BPEN2) is inverted by a fifth inverter I5 to drive the fifth PMOS transistor P5. An eighth NMOS transistor N8 that is driven by an inverted signal of the second boot pump enable signal (BPEN2) is connected between the ground voltage (Vss) terminal and the ninth node Q9. The second boot pump enable signal (BPEN2) is inverted by the sixth inverter I6 to drive the eighth NMOS transistor N8.

Figure 7:
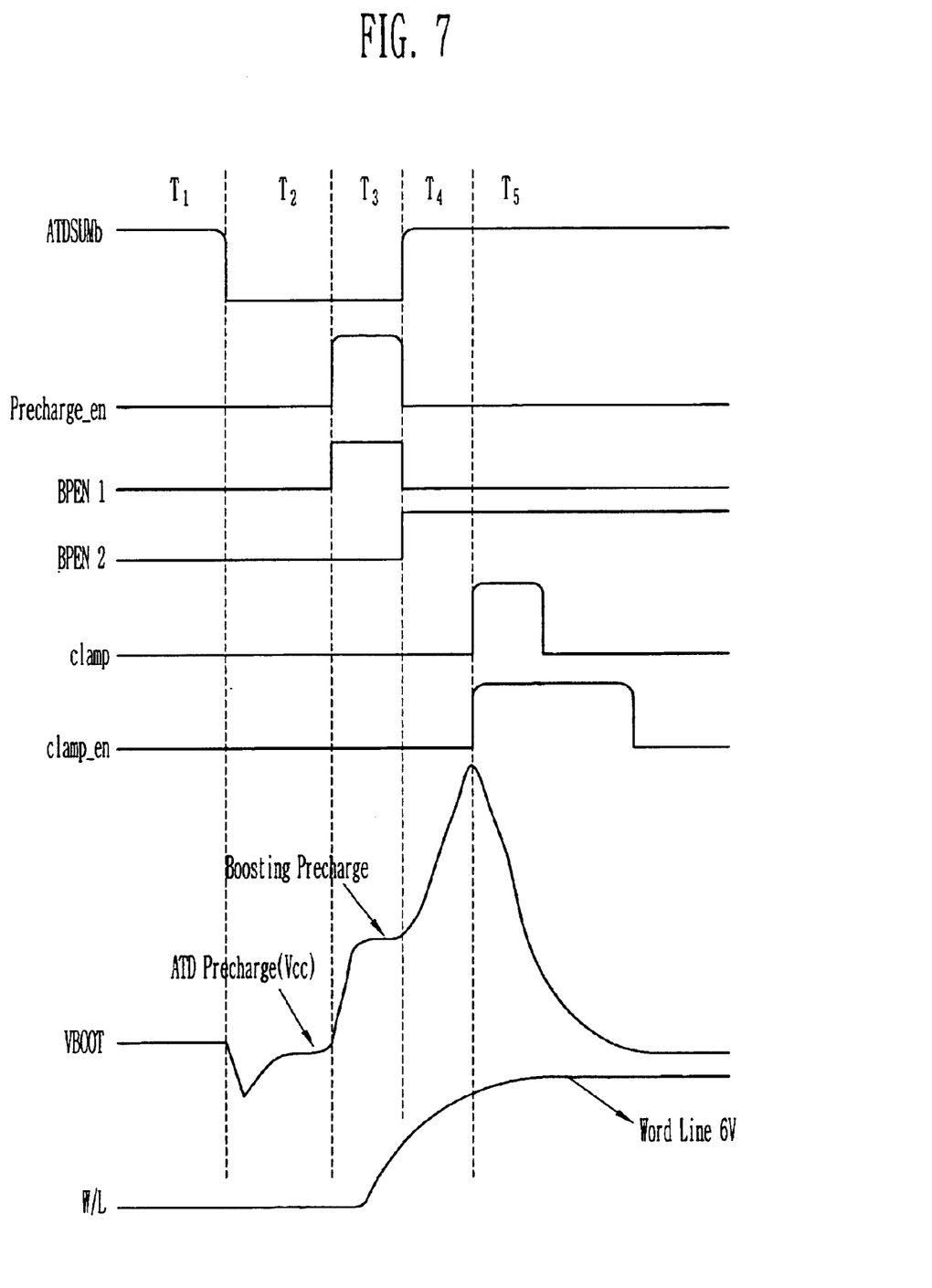
FIG. 7 illustrates waveforms of input signals applied to the boosting circuit.

FIG. 7 illustrates waveforms of the input signals applied to the boosting circuit.

The operations of the preboosting circuit unit 340 and the bootstrap circuit unit 310 in first and second periods (T1, T2) where external input signals are inputted will be described with reference to FIG. 7.

In the first and second periods (T1, T2), the first boot pump enable signal (BPEN1) maintains a Low level. The first boot pump enable signal (BPEN1) of the Low level is inverted by the third inverter I3 and is then inputted to the gate of the second PMOS transistor P2. The second PMOS transistor P2 keeps turned off. Furthermore, the first boot pump enable signal (BPEN1) is inverted by the fourth inverter I4 and is then inputted to the gate of the second NMOS transistor N2. The second NMOS transistor N2 keeps turned on. Therefore, the potential of the third node Q3 maintains the potential of the ground voltage (Vss). At this time, when the first boot pump enable signal (BPEN1) maintains the Low level, the precharge enable signal (Precharge_En) maintains the Low level in the first and second periods (T1, T2). Accordingly, the precharge enable signal (Precharge_En) is inverted by the first inverter I1 and is then inputted to the gate of the first NMOS transistor N1, which keeps the first NMOS transistor N1 turned on. Further, the precharge enable signal (Precharge_En) of the Low level is inverted by the second inverter I2 and is then inputted to the gate of the first PMOS transistor P1. The first PMOS transistor P1 keeps turned off. Therefore, the first node Q1 maintains the potential of the power supply voltage (Vcc). As a result, in the first period (T1) and the second period (T2), the preboosting circuit unit 340 does not affect the bootstrap circuit unit 310 since the first PMOS transistor P1 keeps turned off.

Next, the operation of the preboosting circuit unit 340 in the third period (T3) where the external input signals are inputted will be described. If the first boot pump enable signal (BPEN1) becomes a High level, the first boot pump enable signal (BPEN1) is inverted by the third inverter I3. The second PMOS transistor P2 is thus turned on. Further, if the first boot pump enable signal (BPEN1) becomes the High level, it is inverted by the fourth inverter I4 and the second NMOS transistor N2 is thus turned off. Therefore, the potential of the third node Q3 has the potential of the ground voltage (Vss) in the first period (T1) and the second period (T2), or the potential of the third node Q3 has the potential of the power supply voltage (Vcc) in the third period (T3). The potential of the third node Q3 is applied to the first capacitor C1. Accordingly, the potential of the first node Q1 is boosted to a High level higher than the power supply voltage (Vcc) due to the coupling effect of the first capacitor C1. At this time, if the first boot pump enable signal (BPEN1) becomes the High level in the third period (T3), the precharge enable signal (Precharge_En) also becomes the High level. The precharge enable signal (Precharge_En) is inverted by the first inverter I1 to turn off the first NMOS N1. Further, the precharge enable signal (Precharge_En) is inverted by the second inverter I2 to turn on the first PMOS transistor P1. As a result, the potential of the second node Q2 has a high potential in the third period (T3), which is same as the potential of the first node Q1.

Meanwhile, the second node Q2 is connected to the seventh NMOS transistor N7 of the bootstrap circuit unit 310. In other words, the second node Q2 is connected to the drain terminal of the seventh NMOS transistor N7 of the triple transistor. Therefore, the boosting voltage (VBOOT) is instantly increased in the third period (T3) by the second node Q2 having the high potential, as shown in FIG. 7. This will be described later.

The operation of the bootstrap circuit unit 310 in the third period (T3) will be described.

As the clamp enable signal (clamp_en) maintains a Low level in the third period (T3), the third PMOS transistor P3 keeps turned on. If the first boot pump enable signal (BPEN1) becomes a High level in the third period (T3), the third NMOS transistor N3 is turned on. Therefore, the fifth node Q5 has the potential of the ground voltage (Vss) and the fourth PMOS transistor P4 are turned off. Since the potential of the fifth node Q5 has the potential of the ground voltage (Vss), the fourth NMOS transistor N4 is also turned off. Further, if the first boot pump enable signal (BPEN1) becomes the High level, the first boot pump enable signal (BPEN1) is applied to the second capacitor C2 and the potential of the sixth node Q6 is increased to become the High level due to the coupling effect. The seventh NMOS transistor N7 and the sixth NMOS transistor N6 are thus turned on. Accordingly, as the seventh NMOS transistor N7 is turned on, the potential of the eighth node Q8 has the same level as the potential of the second node Q2 higher than the power supply voltage (Vcc) and the boosting voltage (VBOOT) is raised as in the third period (T3) of FIG. 7.

Meanwhile, in the third period (T3), the second boot pump enable signal (BPEN2) maintains a High level, and the second boot pump enable signal (BPEN2) is inverted by the fifth inverter I5 and the fifth PMOS transistor P5 keeps turned off. Further, the second boot pump enable signal (BPEN2) is inverted by the sixth inverter I6 and the eighth NMOS transistor N8 keeps turned on. The potential of the ninth node Q9 thus maintains the potential of the ground voltage (Vss).

The operations of the preboosting circuit unit 340 and the bootstrap circuit unit 310 in a fourth period (T4) will be described.

In the fourth period (T4), the first boot pump enable signal (BPEN1) becomes a Low level, the first boot pump enable signal (BPEN1) is inverted by the third inverter I3 and the second PMOS transistor P2 is turned off. Further, the first boot pump enable signal (BPEN1) is inverted by the fourth inverter I4, thus making the second NMOS transistor N2 turned on. At this time, in the fourth period (T4), the precharge enable signal (Precharge_En) becomes the Low level. Thus, the precharge enable signal (Precharge_En) is inverted by the first inverter I1 and the first NMOS N1 is thus turned on. Further, the precharge enable signal (Precharge_En) is inverted by the second inverter I2 and the first PMOS transistor P1 is thus turned off. Accordingly, as the first PMOS transistor P1 is turned off in the fourth period T4, the preboosting circuit unit 340 does not affect the bootstrap circuit unit 310.

Meanwhile, in the fourth period (T4), since the clamp enable signal (clamp_en) maintains the Low level, the third PMOS transistor P3 keeps turned on. If the first boot pump enable signal (BPEN1) become the Low level, the third NMOS transistor N3 is turned off and the fourth PMOS transistor P4 is turned on. Also if the first boot pump enable signal (BPEN1) becomes the Low level in the fourth period (T4), the first boot pump enable signal (BPEN1) is applied to the second capacitor C2 and the potential of the sixth node Q6 is dropped to the Low level due to the coupling effect. At this time, as the fourth PMOS transistor P4 is turned on, the potential of the fifth node Q5 becomes the Low level. Since the potential of the fifth node Q5 is dropped to the Low level, the fourth NMOS transistor N4 is turned off. As the potential of the sixth node Q6 is at the Low level, the seventh NMOS transistor N7 and the sixth NMOS transistor N6 are turned off.

Meanwhile, in the fourth period (T4), the second boot pump enable signal (BPEN2) becomes a High level, the second boot pump enable signal (BPEN2) is inverted by the fifth inverter I5 and the fifth PMOS transistor P5 is turned on. Also, if the second boot pump enable signal (BPEN2) becomes a High level, it is inverted by the sixth inverter I6 and the eighth NMOS transistor N8 is thus turned off. Therefore, the potential of the ninth node Q9 is raised to the potential of the power supply voltage (Vcc) and the potential of the eighth node Q8 is increased to the High level due to the coupling effect of the third capacitor C3. Therefore, the potential of the eighth node Q8 is increased and the boosting voltage (VBOOT) being the output voltage of the eighth node Q8 is raised as in the fourth period (T4) of FIG. 7.

According to the present invention, after the boosting voltage (VBOOT) is rapidly increased to a constant voltage level in two steps using the preboosting circuit unit 340 and the bootstrap circuit unit 310, the boosting voltage (VBOOT) is dropped through the clamp circuit unit to generate the final target voltage. Therefore, read access time is fast in a read operation, current consumption can be minimized and a stabilized word line voltage (W/L) can be generated.

As described above, according to the present invention, the bootstrap circuit unit is precharged with the power supply voltage (Vcc) and is boosted by the power supply voltage (Vcc). Therefore, the boosting circuit of the present invention is usually used in a NOR type read operation that requires a high speed among the circuits having a function of raising the potential to a desiring level while satisfying a desired coupling ratio. Since there is limitation in the amount of the power supply voltage (Vcc) at a low power supply voltage 1.5V, in order to overcome this, the present inventors pay our attention to the fact that a desired level could be reached more rapidly if the voltage is boosted to the power supply voltage (Vcc) in the potential higher than the power supply voltage (Vcc). For this, by adding a small preboosting circuit to the node that is precharged with the power supply voltage (Vcc), it is possible to maximize the boosting effect through consecutive execution before the main boosting is executed while stopping connection of the node to be boosted, using automatic precharge through a native transistor. As such, it is possible to rapidly increase the inclination of the peak by maximizing the main boosting effect using a circuit through preboosting. At this time, a conventional circuit for dropping the voltage to a desired level after the voltage is rapidly increased can be used. Therefore, it is possible to obtain the same effect as the prior art even using a capacitor having a main boosting capacity of a tenth. Thus, the present invention has new effects that it can minimize consumption of current through two-step boosting and reduce by maximum the area of a capacitor that occupies the most area of the bootstrap.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A boosting circuit in a semiconductor memory device, comprising:
    a preboosting circuit unit for pumping a power supply voltage to output a high voltage using the coupling effect of a capacitor upon a boosting;
    a bootstrap circuit unit for selectively boosting the power supply voltage and the output voltage of the preboosting circuit unit to output a boosting voltage;
    a reference voltage generator for outputting a constant reference voltage regardless of variation in the power supply voltage; and
    a clamp circuit unit for comparing the boosting voltage outputted from the bootstrap circuit unit with the reference voltage outputted from the reference voltage generator, wherein the clamp circuit unit drops the boosting voltage to a target voltage when the boosting voltage is higher than the reference voltage.

2. The boosting circuit as claimed in claim 1, wherein the preboosting circuit unit comprises:
    a first transistor connected between a power supply voltage terminal and a first node, and driven by a first signal;
    a second transistor connected between the first node and a second node, and driven by the first signal;
    a capacitor connected between the first node and a third node;
    a third transistor connected between the power supply voltage terminal and the third node, and driven by a second signal; and
    a fourth transistor connected between a ground voltage terminal and the third node, and driven by the second signal,
    wherein the power supply voltage is pumped using the coupling effect of the capacitor by the second signal, whereby the high voltage is outputted to the second node.

3. The boosting circuit as claimed in claim 2, wherein the first transistor and the fourth transistor are NMOS transistors, and the second transistor and the third transistor are PMOS transistors.

4. The boosting circuit as claimed in claim 2, wherein the first signal is an inverted signal of a precharge enable signal, the second signal is an inverted signal of a first boot pump enable signal, and the precharge enable signal and the first boot pump enable signal are inputted as waveforms of the same level.

5. The boosting circuit as claimed in claim 1, wherein the bootstrap circuit unit comprises:
    a first PMOS transistor connected between a power supply voltage terminal and a first node, and driven by a first signal;
    a first NMOS transistor connected between a second node and a ground voltage terminal, and driven by a second signal;
    a second NMOS transistor connected between the first node and a third node, and driven by the potential of the second node;
    a second PMOS transistor connected between the second node and the third node, and driven by the second signal;
    a first capacitor connected between the third node and a fourth node for receiving the second signal as an input;
    a third NMOS transistor connected between the ground voltage terminal and the second node, and driven by the first signal;
    a fourth NMOS transistor connected between the power supply voltage terminal and a fifth node for outputting a boosting voltage, and driven by the potential of the third node;
    a fifth NMOS transistor connected between the first node and the fifth node, and driven by the potential of the third node, wherein the fifth NMOS transistor has a drain terminal to which the output signal of the preboosting circuit unit is inputted;
    a second capacitor connected between the fifth node and a sixth node;

a third PMOS transistor connected between the power supply voltage terminal and the sixth node, and driven by a third signal; and a sixth NMOS transistor connected between the ground voltage terminal and the sixth node, and driven by the third signal.

6. The boosting circuit as claimed in claim 5, wherein the fifth NMOS transistor has a triple transistor structure having a P-well to which the potential of the first node is inputted, a drain terminal to which the potential of the second node is inputted, and a source terminal to which the potential of the fifth node is inputted.

7. The boosting circuit as claimed in claim 5, wherein the fourth NMOS transistor is a native transistor, in which automatic precharge occurs.

8. The boosting circuit as claimed in claim 5, wherein the first signal is a clamp enable signal, the second signal is a first boot pump enable signal, and the third signal is an inverted signal of a second boot pump enable signal.

* * * * *

UNITED STATES PATENT AND TRADEMARK OFFICE
CERTIFICATE OF CORRECTION

PATENT NO. : 6,865,118 B2
DATED : March 8, 2005
INVENTOR(S) : Yi J. Kwon It is certified that error appears in the above-identified patent and that said Letters Patent is hereby corrected as shown below:

Title page,
Item [75], Inventor, after "Yi Jin Kwon" please delete "Ichon-Shi" and insert
-- Kyungki-Do -- in its place.

Signed and Sealed this

Twenty-third Day of August, 2005

JON W. DUDAS
*Director of the United States Patent and Trademark Office*